United States Patent
Cho

(10) Patent No.: US 9,122,012 B2
(45) Date of Patent: Sep. 1, 2015

(54) OPTICAL UNIT AND ORGANIC LIGHT EMITTING DIODE DISPLAY INCLUDING THE SAME

(71) Applicant: Samsung Display Co., Ltd., Yongin, Gyeonggi-do (KR)

(72) Inventor: Jong-Hwan Cho, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 279 days.

(21) Appl. No.: 13/757,085

(22) Filed: Feb. 1, 2013

(65) Prior Publication Data
US 2014/0078582 A1    Mar. 20, 2014

(30) Foreign Application Priority Data
Sep. 19, 2012   (KR) .................. 10-2012-0104228

(51) Int. Cl.
*G02B 5/30*    (2006.01)
*G02B 1/118*   (2015.01)

(52) U.S. Cl.
CPC .............. *G02B 5/3025* (2013.01); *G02B 1/118* (2013.01)

(58) Field of Classification Search
CPC ................................ G02B 5/3025; G02B 5/30
See application file for complete search history.

(56) References Cited

U.S. PATENT DOCUMENTS

2010/0321621 A1* 12/2010 Kikuchi et al. ............... 349/122

FOREIGN PATENT DOCUMENTS

| KR | 10-2007-0028691 A | 3/2007 |
| KR | 10-2011-0107694 A | 10/2011 |
| KR | 10-2011-0122441 A | 11/2011 |

* cited by examiner

*Primary Examiner* — Joseph P Martinez
(74) *Attorney, Agent, or Firm* — Knobbe, Martens, Olson & Bear, LLP

(57) ABSTRACT

An optical unit is disclosed. In one aspect, the optical unit includes a polarizing plate, a first protective layer positioned on a first side of the polarizing plate and a first adhesive layer positioned on the first protective layer. A plurality of protrusions are formed on the surface of the first protective layer.

8 Claims, 11 Drawing Sheets

OPTICAL UNIT AND ORGANIC LIGHT EMITTING DIODE DISPLAY INCLUDING THE SAME

RELATED APPLICATIONS

This application claims priority to and the benefit of Korean Patent Application No. 10-2012-0104228 filed in the Korean Intellectual Property Office on Sep. 19, 2012, the entire contents of which are incorporated herein by reference.

BACKGROUND

1. Field

The described technology generally relates to an optical unit and an organic light emitting diode display including the same, and more particularly, to an optical unit including a polarizing plate and an organic light emitting diode display including the same

2. Description of the Related Technology

A display device is a device for displaying images, and recently, a display device including an organic light emitting diode has received attention.

Since the organic light emitting diode has a self-emission characteristic and does not require a separate light source unlike a liquid crystal display device, a thickness and a weight of the entire display device may be reduced to improve a flexible characteristic of the display device. Further, the organic light emitting diode has high-definition characteristics such as low power consumption, high luminance, and a high response speed.

SUMMARY

One inventive aspect is an optical unit and an organic light emitting diode display having advantages of increasing adhesion between multilayered thin films in a flexible display panel.

Another aspect is an optical unit and an organic light emitting diode display having advantages of preventing reflection of light to increase transmittance.

Another aspect is an optical unit, including: a polarizing plate; a first protective layer positioned on a first side of the polarizing plate; and a first adhesive layer positioned on the first protective layer, in which a plurality of protrusions is formed on the surface of the first protective layer.

The optical unit may further include a second adhesive layer positioned on a second side of the polarizing plate; and a second protective layer positioned on the second adhesive layer and having a plurality of protrusions.

A distance between the protrusions may be 20 nm to 300 nm, a height of the protrusion may be 50 nm to 1,000 nm, and a width of the protrusion may be 20 nm to 300 nm.

Thicknesses of the first protective layer and the second protective layer may be 40 µm or less.

The first protective layer and the second protective layer may contain at least one of triacetyl cellulose (TAC), polyethylene terephthalate (PET), polycarbonate, polymethylmethacrylate (PMMA), and polyethylene naphthalate (PEN).

The optical unit may further include a retardation plate positioned on the second protective layer.

Another aspect is a display device, including: a flexible display panel including a display area displaying images and a non-display area adjacent to the display area; and an optical unit positioned on the display panel.

The display device may further include a window positioned on the optical unit.

The display panel may include an organic light emitting diode.

Like the embodiment, when the optical unit having the protrusions is formed, a contact area between thin films increases and thus adhesion is improved. Accordingly, it is possible to provide an organic light emitting diode display in which a lifting phenomenon does not occur due to bending of a flexible substrate.

Further, since a change in a refractive index is decreased by the protrusions, it is possible to increase light emission efficiency.

DETAILED DESCRIPTION

Figure 1:
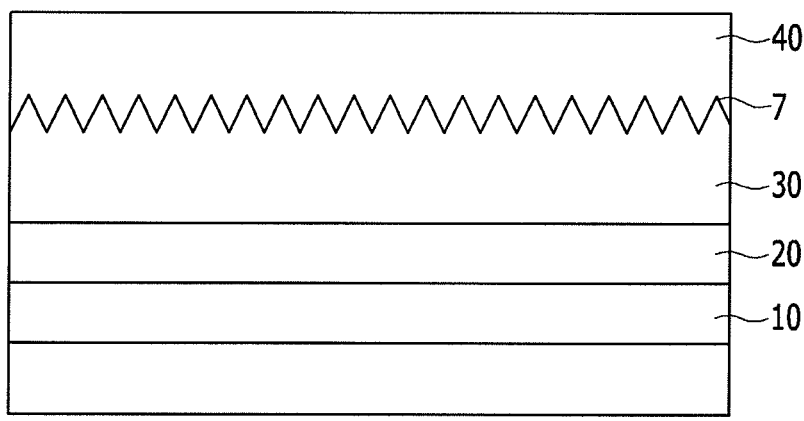
FIG. 1 is a schematic cross-sectional view of an optical unit according to an embodiment.

In general, a display device includes a display panel displaying images, an optical unit positioned on the display panel and including a polarizing plate, and a window positioned on the optical unit and protecting the optical unit. The display device generally requires a multilayer having three or more layers in order to form a low reflective structure in a wide wavelength range. However, in the flexible panel including the multilayer structure, since adhesion between the multilayered thin films becomes weak due to bending of the panel, there is problem in that delamination occurs.

Embodiments will be described more fully hereinafter with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each configuration shown in the drawings are arbitrarily shown for understanding and ease of description, but the present invention is not limited thereto.

In the drawings, the thickness of layers, films, panels, regions, etc., may be exaggerated for clarity. Further, in the drawings, for understanding and ease of description, the thickness of some layers and areas may be exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, throughout the specification, the word "on" will be understood to be positioned above or below a target element and will be necessarily not understood to be positioned at an upper side based on a gravity direction.

Hereinafter, an optical unit according to an embodiment will be described with reference to the accompanying drawings.

Figure 2:
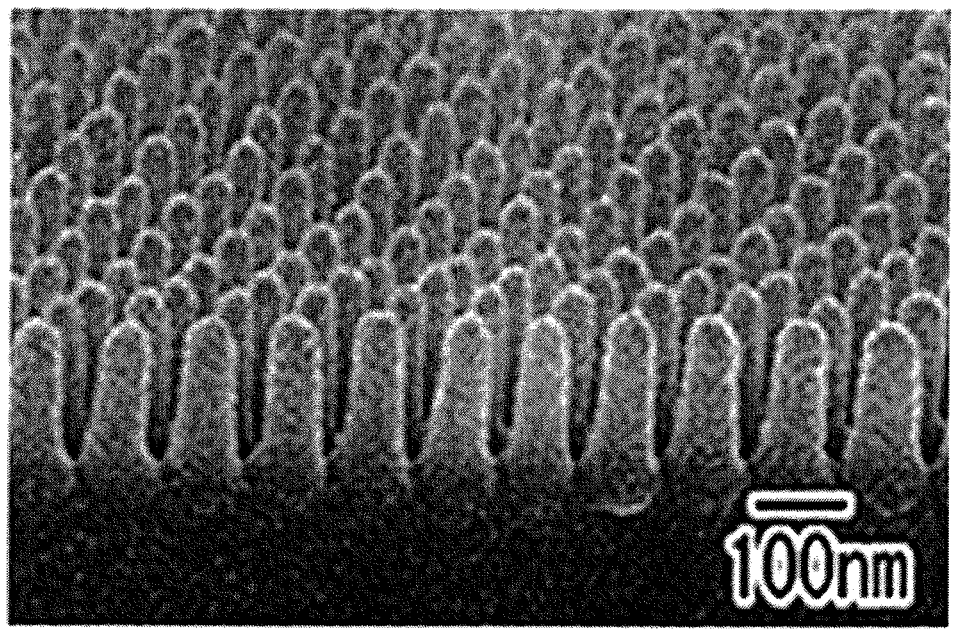
FIG. 2 is a photograph of a protrusion according to an embodiment.

FIG. 1 is a schematic cross-sectional view of an optical unit according to an embodiment, FIG. 2 is a photograph of a protrusion according to an embodiment, and FIGS. 3A to 3E are cross-sectional views of various protrusions according to another embodiment.

As illustrated in FIG. 1, an optical unit 1001 according to an embodiment includes a first protective layer 10, a polarizing plate 20, a second protective layer 30, and a first adhesive layer 40.

The first protective layer 10 and the second protective layer 30 may contain at least one of triacetyl cellulose (TAC), polyethylene terephthalate (PET), polycarbonate, polymethylmethacrylate (PMMA), and polyethylene naphthalate (PEN) as a transparent material.

The first and second protective layers 10 and 30 may prevent both sides of the polarizing plate 20 from being damaged and may increase hardness as compared with the polarizing plate 20. The protective layers 10 and 30 may be formed with a thickness of about 40 μm or less in order to acquire a flexible characteristic.

A plurality of protrusions 7 as illustrated in FIG. 2 is formed on the surface of the second protective layer 30. A distance L between the protrusions 7 may be a wavelength or less of light, for example, about 20 nm to about 300 nm, and a height H may be about 50 nm to about 1,000 nm, and a width D of the protrusion may be about 20 nm to about 300 nm.

In one embodiment, when the plurality of protrusions 7 are formed, a contact area between an upper layer and a lower layer is increased and as a result, surface energy between the two thin films is increased. Accordingly, adhesion between the lower and upper layers is increased to minimize a lifting phenomenon even due to the bending of the flexible panel.

Further, when the protrusions are formed like the present embodiment, a rapid change in a refractive index for light passing through the optical unit is decreased, and as a result, transmittance of the display device may be improved while an additional anti-reflective layer is not formed.

That is, in the case where light is incident to the optical unit, diffractive light exists in addition to a relationship of incident light, reflective light, and transmitting light and thus the plurality of protrusions slowly changes the refractive index of light, thereby acquiring a low-reflection effect. Accordingly, an effect of increasing the transmittance may be acquired.

The protrusions 7 may have all structural surfaces capable of increasing surface energy as illustrated in FIG. 3.

Figure 3A:
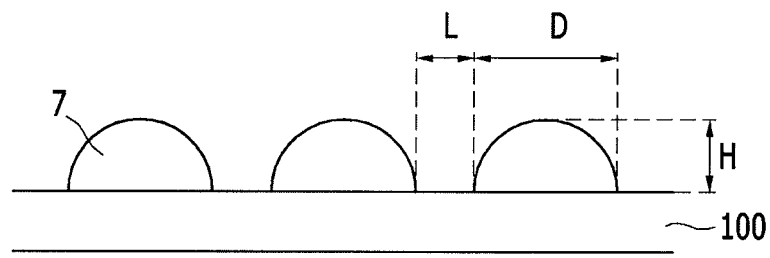
FIGS. 3A to 3E are cross-sectional views of various protrusions according to another embodiment.
Figure 3B:
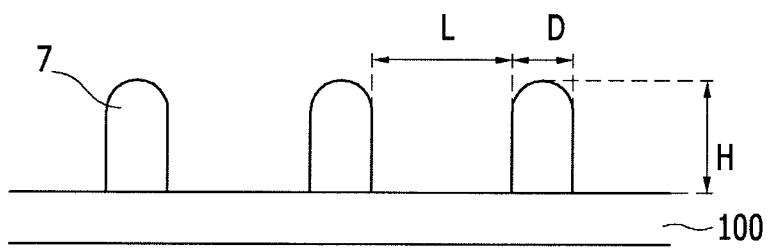
Figure 3C:
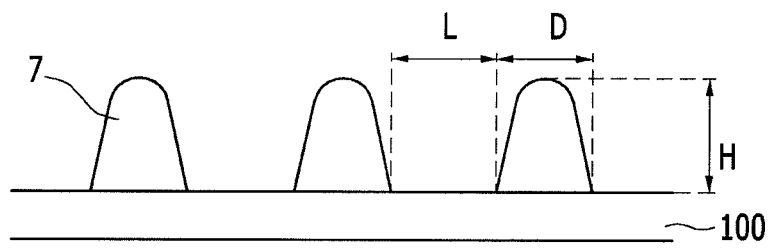
Figure 3D:
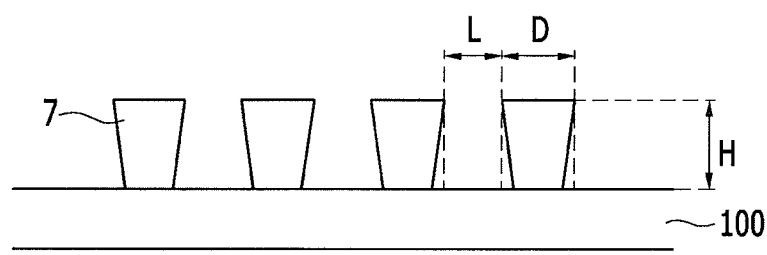
Figure 3E:
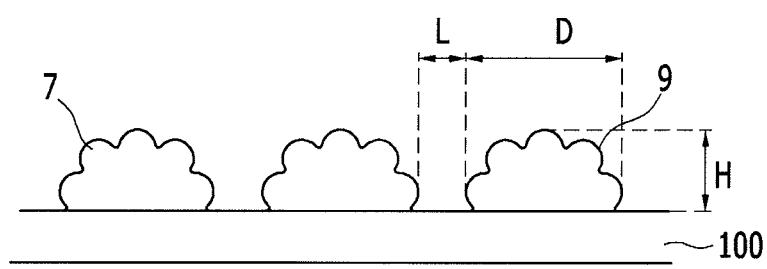

That is, as illustrated in FIG. 3A, the protrusion may have a cylindrical shape and the upper portion may have a hemispherical structure, or as illustrated in FIG. 3B, the protrusion may have a hemispherical structure, or as illustrated in FIGS. 3C and 3D, the protrusion may have a reverse-tapered structure. Further, as illustrated in FIG. 3E, the protrusion may have a plurality of small protrusions 9.

The protrusions 7 may be formed by an imprinting method after forming a thin film to form the protrusions 7, and the protrusions 7 may be formed by blasting by spraying particulates, etching using a chemical agent, and surface-coating using inorganic or organic particulates. Further, the protrusions 7 may be formed by a photocurable transferring method of coating a photocurable resin on a resin to form the protrusions.

The polarizing plate 20 has a polarization axis and linear-polarize light passing through the polarizing plate in the polarization-axial direction. In detail, the polarizing plate 20 transmits light which coincides with the polarization axis and absorbs light which does not coincide with the polarization axis. As a result, when the light passes through the polarizing plate 20, the light is linearly polarized in the polarization-axial direction.

The polarizing plate 20 may have a matrix structure and in detail, may include a matrix, iodine, a dye, and the like. Here, the matrix may have a structure made of polyvinyl alcohol (PVA).

The polarizing plate 20 may be manufactured by a method of bonding iodine and a dye after stretching a polyvinyl alcohol film, a method of stretching iodine and a dye after absorbing the iodine and the dye in the polyvinyl alcohol film, and a method of dyeing and stretching iodine and a dye on the polyvinyl alcohol film at the same time.

The polarizing plate 20 which is thin and has a weak strength due to the stretching is protected and supported by the first protective layer 10 and the second protective layer 30.

The first adhesive layer 40 for bonding the panel or the window may be an adhesive such as an optical clear adhesive (OCA) material or an adhesive material such as an optical clear resin.

The first adhesive layer 40 fills the distance between the protrusions 7, and the contact area with the second protective layer 30 is increased due to the protrusions 7 and thus the adhesion to the second protective layer 30 is improved.

FIGS. 4 to 7 are cross-sectional views of an optical unit according to another embodiments.

Figure 4:
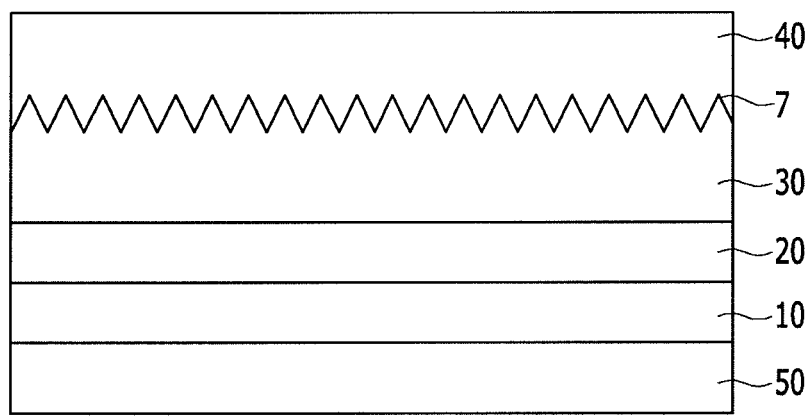
FIGS. 4 to 7 are cross-sectional views of an optical unit according to embodiments.

As illustrated in FIG. 4, an optical unit 1002 includes a retardation plate 50, a first protective layer 10, a polarizing plate 20, and a first adhesive layer 40.

Since most of the elements are the same as the optical unit 1001 of FIG. 1, only different elements will be described in detail.

In the optical unit 1002 of FIG. 4, the first protective layer 10 is formed on the retardation plate 50. The retardation plate 50 retards light passing through the retardation plate 50 by $\lambda/4$, and changes linearly polarized light passing through the retardation plate 50 into circularly polarized light and simultaneously, changes circularly polarized light passing though the retardation plate 50 into linearly polarized light.

As illustrated in FIG. 4, it is possible to suppress reflection of external light incident to the optical unit by laminating the retardation plate 50 and the polarizing plate 20.

Figure 5:
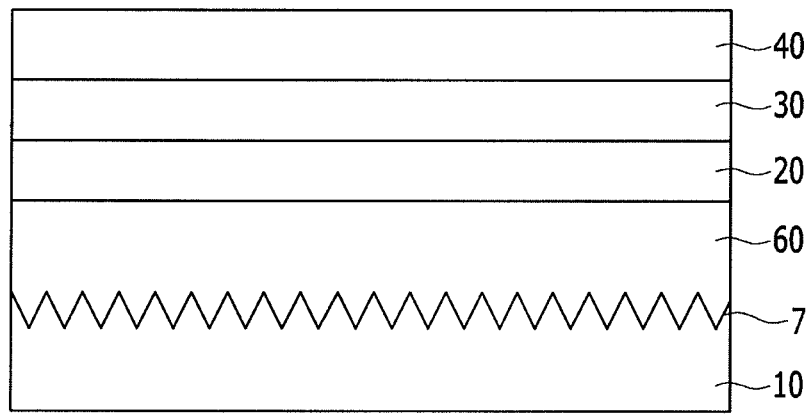

In addition, an optical unit 1003 illustrated in FIG. 5 includes a first protective layer 10, a second adhesive layer 60, a polarizing plate 20, a second protective layer 30, and a first adhesive layer 40.

Since most of the elements are the same as the optical unit 1001 of FIG. 1, only different elements will be described in detail.

In the optical unit 1003 of FIG. 5, protrusions 7 are formed on the surface of the first protective layer 10. In addition, the second adhesive layer 60 is formed on the first protective layer 10.

The second adhesive layer 60 fills a space between the protrusions of the first protective layer 10. Since the contact area between the first and second protective layers 10 and 60 is increased due to the protrusions, surface energy of the second adhesive layer 60 increases and surface adhesion between the first protective layer 10 and the second adhesive layer 60 increases. Accordingly, the polarizing plate 20 is not lifted from the first protective layer 10 due to bending of the polarizing plate 20 positioned on the second adhesive layer 60. In addition, the second adhesive layer 60 provides a planarization surface so that the polarizing plate 20 may be easily formed.

Figure 6:
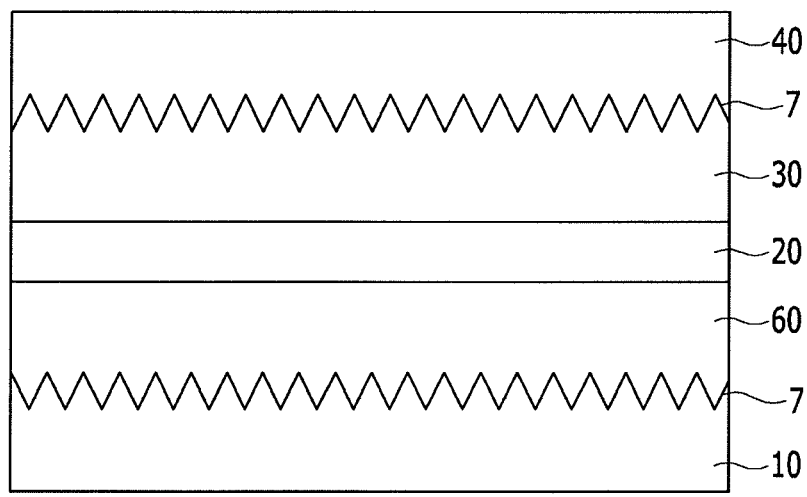

Further, an optical unit 1004 illustrated in FIG. 6 includes a first protective layer 10, a second adhesive layer 60, a polarizing plate 20, a second protective layer 30, and a first adhesive layer 40.

Since most of the elements are the same as the elements of FIGS. 1 and 5, only different elements will be described in detail.

The optical unit 1004 of FIG. 6, in which the protrusions are formed on the protective layers 10 and 30 disposed on both sides of the polarizing plate 20 and thus adhesion between the polarizing plate 20 and the protective layers 10 and 30 is reinforced, may have more strong adhesion than the optical units of FIGS. 1, 4 and 5.

Figure 7:
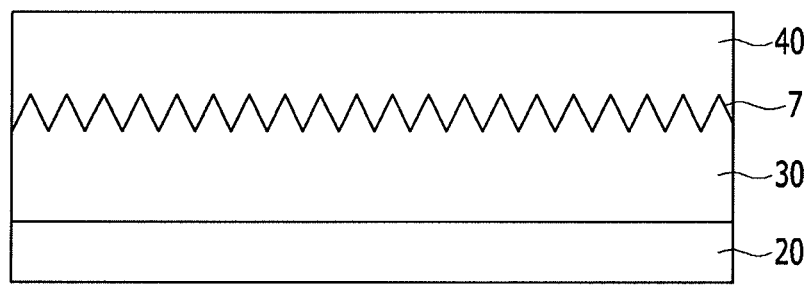

Further, an optical unit 1005 illustrated in FIG. 7 includes a polarizing plate 20, a second protective layer 30, and a first adhesive layer 40.

Since most of the elements are the same as the elements of FIG. 1, only different elements will be described in detail.

In the optical unit 1005 of FIG. 7, the second protective layer 30 is formed only on the polarizing plate 20. The second protective layer 30 and the first protective layer of FIGS. 1, 4 to 6 have higher hardness than the polarizing plate, and as a result, a flexible characteristic may deteriorate. Accordingly, as illustrated in FIG. 7, only the second protective layer 30 is formed and as a result, the flexible characteristic may be increased.

Then, an organic light emitting diode display including the above optical unit will be described in detail with reference to FIG. 8.

Figure 8:
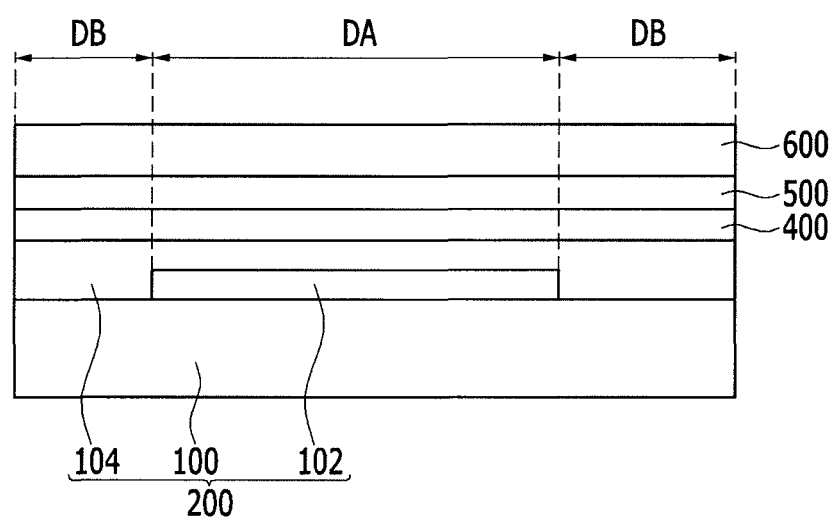
FIG. 8 is a schematic cross-sectional view of an organic light emitting diode display according to an embodiment.

FIG. 8 is a schematic cross-sectional view of an organic light emitting diode display according to an embodiment.

Referring to FIG. 8, a display device 2001 according to an embodiment includes a display panel 200, a touch panel 400 positioned on the display panel 200, an optical unit 500 positioned on the touch panel 400, and a window 600 positioned on the optical unit 500.

The display panel 200 has a display area DA displaying images and a non-display area DB adjacent to the display area DA and has a flexible characteristic. The display panel 200 includes a substrate 100, a wiring unit (not illustrated), an organic light emitting diode 102, and an encapsulation member 104. The organic light emitting diode 102 is positioned in the display area DA, and the wiring unit may be positioned in the non-display area DB.

The substrate 100 is made of a light transmitting material and may be a flexible polymer substrate.

The wiring unit and the organic light emitting diode 102 are positioned on the substrate 100, and the encapsulation member 104 is formed on the entire surface of the substrate to cover and protect the organic light emitting diode 102. The substrate 100 and the encapsulation member 104 are bonded and encapsulated with each other to protect the wiring unit and the organic light emitting diode 102 from external interference and external moisture.

The wiring unit includes a first thin film transistor Q1 and a second thin film transistor Q2 (illustrated in FIG. 9) and transfers signals to the organic light emitting diode 102 to drive the organic light emitting diode 102. The organic light emitting diode 102 emits light according to a signal received from the wiring unit.

The organic light emitting diode 102 is positioned on the substrate 100 and receives the signals from the wiring unit to display images.

Hereinafter, an internal structure of the display panel 200 according to one embodiment will be described in detail with reference to FIGS. 9 and 10.

Figure 9:
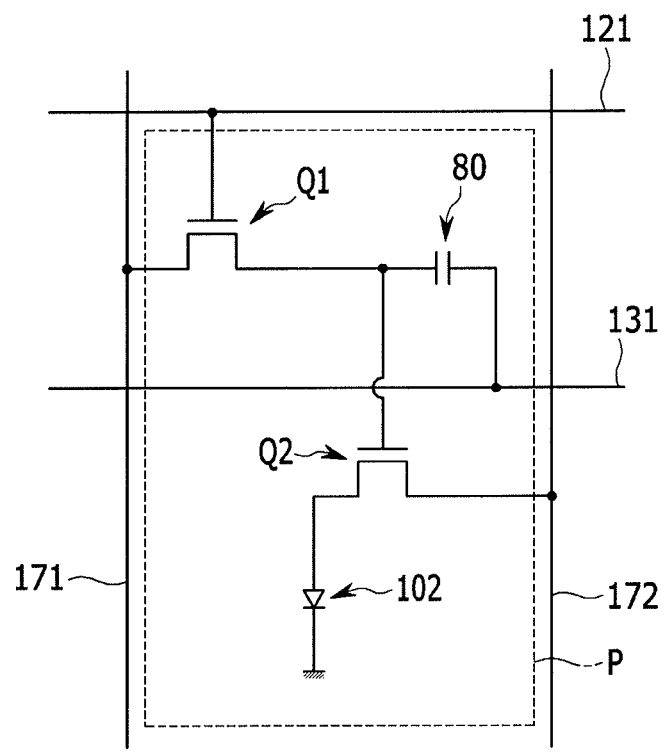
FIG. 9 is an equivalent circuit diagram of one pixel of a display panel according to an embodiment.
Figure 10:
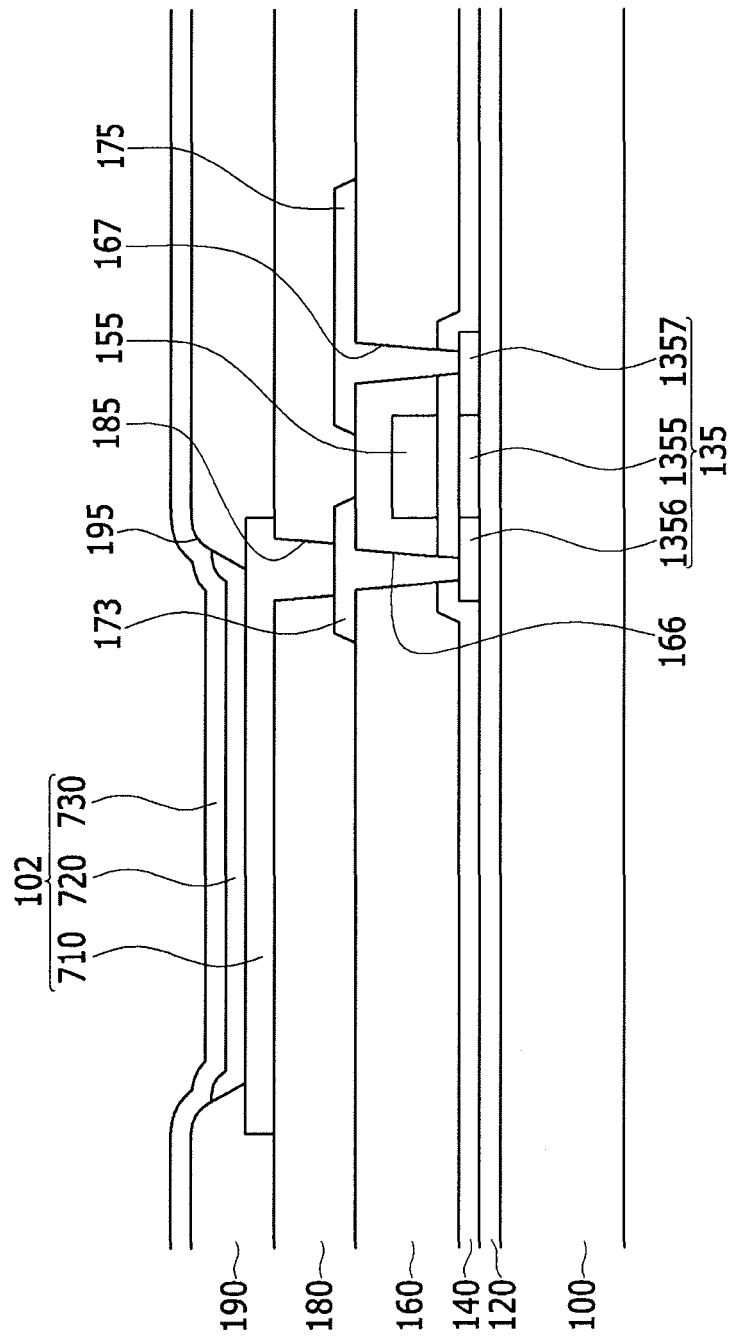
FIG. 10 is a cross-sectional view of one pixel illustrated in FIG. 9.

FIG. 9 is an equivalent circuit diagram of one pixel of a display panel according to the embodiment, and FIG. 10 is a cross-sectional view of one pixel illustrated in FIG. 9.

Hereinafter, a detailed structure of the wiring unit and the organic light emitting diode 102 are illustrated in FIGS. 9 and 10, but the embodiment is not limited to the structure illustrated in FIGS. 9 and 10. The wiring unit and the organic light emitting diode 102 may be formed in various structures in a range capable of being easily modified by those skilled in the art. For example, in the accompanying drawings, as the display device, an active matrix display device having a 2Tr-1Cap structure which includes two thin film transistors TFTs and one capacitor in one pixel is illustrated, but the present invention is not limited thereto. Accordingly, in the display device, the number of thin film transistors, the number of capacitors, and the number of wirings are not limited. Meanwhile, the pixel means a minimum unit of displaying an image, and the display device displays images by using a plurality of pixels.

A cross-sectional view of FIG. 10 illustrates only the thin film transistor Q2 connected with the organic light emitting diode 102.

As illustrated in FIGS. 9 and 10, the display panel 200 includes a first thin film transistor Q1, a second thin film transistor Q2, a capacitor 80, and an organic light emitting diode 102 which are formed for each pixel, respectively. Here, an element including the first thin film transistor Q1, the second thin film transistor Q2, and the capacitor 80 is referred to a wiring unit. In addition, the wiring unit further includes a gate line 121 disposed in on direction of the substrate 100, a data line 171 insulatively crossing the gate line 12, and a constant voltage line 172. Here, one pixel may be defined by a boundary of the gate line 121, the data line 171, and the constant voltage line 172, but is not necessarily limited thereto.

The organic light emitting diode 102 includes a first electrode 710, an organic emission layer 720 formed on the first electrode 710 and a second electrode 730 formed on the organic emission layer 720.

The organic emission layer 720 is formed in an opening 195 of a pixel defining layer 190 having the opening 195.

Here, the first electrode 710 is an anode as a hole injection electrode, and the second electrode 730 is a cathode as an electron injection electrode. However, the present embodiment is not necessarily limited thereto, and the first electrode 710 may be the cathode and the second electrode 730 may be the anode according to a driving method of the display device. A hole and an electron are injected from the first electrode 710 and the second electrode 730 into the organic emission layer 720, respectively, and when an exiton, in which the hole and the electron injected into the organic emission layer 720 are coupled with each other, falls down from an exited state to a ground state, the organic emission layer 720 emits light. Further, the first electrode 710 has a light reflective structure, and the second electrode 730 has a light transmitting structure. As a result, the organic light emitting diode 102 emits the light in an optical unit 400 direction of FIG. 8.

The capacitor 80 is made of a dielectric material positioned between a pair of capacitor electrodes. Capacitance of the capacitor 80 is determined by a voltage between an electric charge charged in the capacitor 80 and a voltage between the two capacitor electrodes. The capacitor electrode may be made of the same conductive material as the gate electrode 124, the source electrode 173, the drain electrode 175, or the first electrode 710. In addition, the dielectric material as an insulating material positioned between the capacitor electrodes may be, for example, a gate insulating layer 140 or interlayer insulating layers 160 and 180.

The first thin film transistor Q1 is used a switching element which selects a pixel to emit light. A gate electrode of the first thin film transistor is connected to the gate line 121, a source electrode is connected to the data line 171, a drain electrode is connected with a gate electrode 135 of the second thin film transistor Q2.

The second thin film transistor Q2 includes a semiconductor 135, a gate electrode 124, a source electrode 173, and a drain electrode 174. The first thin film transistor Q1 also includes a semiconductor, a gate electrode, a source electrode, and a drain electrode.

The second thin film transistor Q2 applies a driving power supply for light-emitting the organic emission layer 720 of the organic light emitting diode 102 in the selected pixel to the second electrode 730. The gate electrode 135 of the second thin film transistor Q2 is connected with the drain electrode of the first thin film transistor, the source electrode 173 is connected with the constant voltage line 172, and the drain electrode 175 is connected with the first electrode 710 of the organic light emitting diode 102.

As such, in the pixel, when the first thin film transistor Q1 is instantaneously turned on, the capacitor 80 is charged and in this case, the charged electric charge is proportional to a potential of a voltage applied from the data line 171. In addition, when a signal increasing a voltage in a period of one frame is inputted to the capacitor line 131 while the first thin film transistor Q1 is turned off, a gate potential of the second thin film transistor Q2 increases according to a voltage, in which a level of the voltage applied based on the potential charged in the capacitor 80 is applied through the capacitor line 131. In addition, the second thin film transistor Q2 is turned on when the gate potential exceeds a threshold voltage. Then, the voltage applied to the constant voltage line 172 is applied to the organic light emitting diode 102 through the second thin film transistor Q2, and the organic light emitting diode 102 emits the light.

Referring back to FIG. 8, the encapsulation member 104 for encapsulating the organic light emitting diode 102 on the substrate 100 may be formed by at least one of organic layers or inorganic layers.

The touch panel 400 is positioned on the encapsulation member 104, and the touch panel 400 may be a capacitive type or a decompressing type and detest a touch operation of a user on the display device 2001.

An optical unit 500 is positioned on the touch panel 400, and an adhesive layer (not illustrated) may be positioned between the touch panel 400 and the optical unit 500.

The optical unit 500 is formed in the same laminated structure as the optical unit 1001 illustrated in FIG. 1. As illustrated in FIG. 1, the optical unit 500 serves to suppress reflection of external light due to the display panel 200 which is an element outputting light and reflection of external light due to the touch panel 400 which is an element detecting the touch operation to improve visibility of the entire display device 2001 and minimize a loss of light emitted from the organic light emitting diode 102 to the outside. Further, the optical unit 500 serves to prevent light reflected from a pad DBd which may be disposed in the non-display area DB adjacent to the display area DA displaying the image, a wiring, or a thin film transistor from being recognized outside.

The window 600 is positioned on the optical film, and may be made of a transparent material so that a user may view the display unit from the front of the display panel 200, and for example, may be made of tempered glass or polymer plastic such as polycarbonate.

The window is positioned at the outermost of the display device 2001 to prevent the display panel 200 and the like therein from being damaged by external impact.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An optical unit, comprising:
    a polarizing plate having first and second surfaces opposing each other,
    a first protective layer positioned on the first surface of the polarizing plate;
    a first adhesive layer positioned on the first protective layer;
    a second adhesive layer positioned on the second surface of the polarizing plate; and
    a second protective layer positioned on the second adhesive layer, wherein a plurality of second protrusions are formed between the second protective layer and the second adhesive layer,
    wherein a plurality of first protrusions are formed between the first protective layer and the first adhesive layer.

2. The optical unit of claim 1, wherein the distance between two neighboring protrusions is about 20 nm to about 300 nm, wherein the height of each of the protrusions is about 50 nm to about 1,000 nm, and wherein the width of each of the protrusions is about 20 nm to about 300 nm.

3. The optical unit of claim 1, wherein the thicknesses of the first and second protective layers are about 40 μm or less.

4. The optical unit of claim 1, wherein each of the first and second protective layers contains at least one of triacetyl cellulose (TAC), polyethylene terephthalate (PET), polycarbonate, polymethylmethacrylate (PMMA), and polyethylene naphthalate (PEN).

5. The optical unit of claim 1, further comprising a retardation plate positioned on the second protective layer.

6. A display device, comprising:
    a flexible display panel including a display area configured to display images and a non-display area adjacent to the display area; and
    an optical unit positioned on the display panel, wherein the optical unit comprises:
    a polarizing plate having first and second surfaces opposing each other;
    a first protective layer positioned on the first surface of the polarizing plate; and
    a first adhesive layer positioned on the first protective layer, wherein a plurality of protrusions are formed between the first protective layer and the first adhesive layer.

7. The display device of claim 6, further comprising a window positioned on the optical unit.

8. The display device of claim 7, wherein the display panel includes an organic light emitting diode.

* * * * *